(12) United States Patent
Ishida

(10) Patent No.: US 6,482,725 B1
(45) Date of Patent: Nov. 19, 2002

(54) GATE FORMATION METHOD FOR REDUCED POLY-DEPLETION AND BORON PENETRATION

(75) Inventor: Emi Ishida, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 154 days.

(21) Appl. No.: 09/640,083

(22) Filed: Aug. 17, 2000

Related U.S. Application Data
(60) Provisional application No. 60/149,421, filed on Aug. 18, 1999.

(51) Int. Cl.[7] ............................................. H01L 21/26
(52) U.S. Cl. ..................... 438/528; 438/459; 438/585
(58) Field of Search ................. 438/459, 528, 438/585, 977, FOR 477, FOR 485, FOR 158, FOR 193

(56) References Cited

U.S. PATENT DOCUMENTS

| | | | |
|---|---|---|---|
| 5,213,986 A | | 5/1993 | Pinker et al. |
| 5,240,883 A | | 8/1993 | Abe et al. |
| 5,266,824 A | | 11/1993 | Abe et al. |
| 5,395,788 A | | 3/1995 | Abe et al. |
| 5,514,235 A | | 5/1996 | Mitani et al. |
| 5,527,724 A | | 6/1996 | Brady et al. |
| 5,674,758 A | * | 10/1997 | McCarthy |
| 5,798,293 A | * | 8/1998 | Harris |
| 6,177,302 B1 | * | 1/2001 | Yamazaki et al. |
| 6,180,495 B1 | * | 1/2001 | Wilson et al. |
| 6,284,628 B1 | * | 9/2001 | Kuwahara et al. |
| 6,323,109 B1 | * | 11/2001 | Okonogi |
| 6,388,290 B1 | * | 5/2002 | Celler et al. |

* cited by examiner

*Primary Examiner*—Wael Fahmy
*Assistant Examiner*—Joannie Adelle Garcia

(57) ABSTRACT

Depletion of dopant from polysilicon gate layers with attendant dopant penetration of underlying gate oxide layers of silicon-based MOS and CMOS transistor devices are reduced or substantially eliminated by a process wherein a thin, high-quality silicon oxide gate insulator layer initially formed on a surface of a heavily-doped polysilicon substrate. The oxide layer is then subjected to impurity ion implantation selected to penetrate a desired depth into the underlying semiconductor substrate for formation of a structurally weakened cleavage plane thereat. The cleaved substrate is then bonded, via the silicon oxide gate insulator layer, to a second, lightly- to moderately-doped semiconductor substrate of similar conductivity type. The thus-produced composite is then subjected to further processing for patterning of the heavily-doped gate and gate insulator layers and to define active areas for formation of source/drain regions in the second, lightly-doped substrate.

16 Claims, 1 Drawing Sheet

GATE FORMATION METHOD FOR REDUCED POLY-DEPLETION AND BORON PENETRATION

RELATED APPLICATIONS

This application claims priority from Provisional Application Ser. No. 60/149,421 filed on Aug. 18, 1999 entitled: "IMPROVED GATE FORMATION METHOD FOR REDUCED POLY-DEPLETION AND BORON PENETRATION", the entire disclosure of which is hereby incorporated by reference therein.

FIELD OF THE INVENTION

The present invention relates to a method of manufacturing semiconductor devices, e.g., MOS and CMOS transistors and integrated circuits containing such transistors on a common semiconductor substrate, with improved processing methodology resulting in increased reliability, quality, and device performance. The present invention has particular applicability in fabricating high-density integration semiconductor devices with design features below about 0.18 μm, e.g., about 0.15 μm and below.

BACKGROUND OF THE INVENTION

The escalating requirements for high density and performance associated with ultra-large-scale integration (ULSI) semiconductor devices require design features of 0.18 μm and below, such as 0.15μm and below, increased transistor and circuit speeds, high reliability, and increased manufacturing throughput and product yield for economic competitiveness. The reduction of design features to 0.18 μm and below challenges the limitations of conventional semiconductor manufacturing techniques.

A conventional approach for forming active devices, such as MOS and/or CMOS transistors in or on a semiconductor substrate, involves formation of a thin gate oxide layer on the active areas of a cleaned surface of the semiconductor substrate, e.g., an about 25–50 Å thick silicon oxide layer in the case of silicon-based devices, followed by blanket deposition thereon of a gate material comprising a relatively thin layer of polysilicon. Inasmuch as the quality of the gate oxide is critical for good device performance, great care is taken during and between these steps to prevent contamination of the gate oxide. For example, the oxidation step for forming the gate oxide layer is typically performed in dedicated furnace tubes, and a direct transfer from gate oxidation to poly deposition is utilized in order to minimize exposure of unprotected gate oxide. A gate mask is then employed for defining the gate area(s) in resist and the polysilicon layer is etched away from the other areas.

In subsequent ion implantation processing to form lightly- or moderately-doped source/drain extension implants in the semiconductor substrate, the implantation energies are carefully selected to be low enough to prevent penetration of the gate oxide by implanted dopant ions. Similarly, the implantation energies of e.g., arsenic and boron difluoride ions employed during formation of moderately- to heavily-doped source/drain implants are selected as to be low enough to form shallow junction n-channel and p-channel S/D regions in the substrate while doping the polysilicon gate areas to relatively good conductivities with minimal dopant penetration/diffusion into the underlying gate oxide. Dopant depletion the gate polysilicon disadvantageously reduces the conductivity thereof, whereas dopant penetration and contamination of the gate oxide layer adversely results in a reduction of the insulative properties thereof. In addition, such boron penetration of the gate oxide degrades MOS transistor properties such as, for example, threshold voltage $V_T$.

However, such standard precautions as described above are generally insufficient for adequately minimizing or preventing deleterious dopant depletion of the polysilicon gate layer and resultant dopant penetration of the underlying gate oxide layer. This is particularly problematic in the case of boron-containing p-type dopants, principally due to the ease with which boron ions or atoms diffuse in silicon substrates. Boron depletion from $p^+$ gate polysilicon layers with attendant gate oxide penetration is of special concern when subsequent device processing includes post-implantation annealing, e.g., RTA, for dopant activation and lattice damage relaxation. For example, it has been reported that boron will penetrate gate oxides of about 12.6 nm or less thick during a 900° C. 30 minute post-implant anneal in nitrogen. Such boron penetration results in a positive shift in the threshold voltage $V_T$ of implanted PMOS transistors. In some instances, boron penetration will continue into underlying silicon. It has also been determined that the presence of fluorine in the gate oxide exacerbates the boron penetration problem. Such boron penetration of the gate oxide can readily occur if the PMOS source/drain regions are implanted with $BF_2$ ion species. As a consequence, implantation of elemental boron ions is considered inherently superior to $BF_2$ implantation for surface-channel PMOS devices in CMOS technologies utilizing p-doped polysilicon gates.

Accordingly, there exists a need for improved semiconductor methodology for fabrication of MOS and/or CMOS transistors and integrated circuit devices comprising a plurality of such devices which does not suffer from the above-described drawbacks associated with the conventional methodology. There exists a need for an improved process for fabricating MOS and/or CMOS transistors which minimizes or substantially eliminates deleterious dopant depletion of the gate polysilicon and associated dopant penetration of the gate oxide, and which provides a significant improvement in transistor threshold voltage stability, and device quality and performance.

DISCLOSURE OF THE INVENTION

An advantage of the present invention is an improved method for fabricating semiconductor devices utilizing gate oxide and polysilicon gate layers wherein dopant depletion of the gate polysilicon layers and resultant dopant penetration of underlying gate oxide layers are minimized or substantially eliminated.

Another advantage of the present invention is an improved method for fabricating a MOS or CMOS transistor device comprising eliminating or substantially reducing depletion of boron p-type dopant from a gate polysilicon layer and its attendant penetration of an underlying gate oxide layer.

Still another advantage of the present invention is an improved silicon-based MOS or CMOS transistor device comprising a polysilicon gate having a reduced amount of boron depletion therefrom and an underlying silicon oxide gate insulator layer having reduced boron penetration thereinto.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of fabricating a semiconductor device comprising a thin gate insulating layer and an overlying electrically conductive gate layer, which method comprises the sequential steps of:

(a) providing a first, heavily-doped, $p^+$ or $n^+$ type semiconductor substrate of predetermined thickness and having opposed, spaced-apart, first and second major surfaces with a plurality of side surfaces therebetween;

(b) forming a thin gate insulating layer on the first major surface of the first substrate;

(c) implanting impurities into the exposed surface of the gate insulating layer, the impurities passing through the gate insulating layer and penetrating the underlying first semiconductor substrate for a predetermined depth below the first major surface, the structural integrity of the first substrate being weakened at the predetermined depth;

(d) cleaving the implanted first substrate along a cleavage plane parallel to the first major surface and located at the predetermined depth;

(e) providing a second semiconductor substrate of same conductivity type as the first semiconductor substrate, the second substrate having opposed, spaced-apart first and second major surfaces; and (f) bonding the exposed surface of the gate insulating insulating layer of the cleaved first substrate to the first major surface of the second substrate; whereby the first, heavily-doped semiconductor substrate forms an electrically conductive gate electrode in contact with the thin gate insulator layer, and wherein dopant depletion of the first semiconductor substrate with attendant penetration of the dopant into the underlying thin gate insulator layer is minimized or substantially prevented.

In embodiments according to the invention, step (a) comprises providing a silicon semiconductor substrate, preferably a polysilicon substrate; step (b) comprises forming a silicon oxide gate insulating layer about 25–50 Å thick; step (c) comprises ion implantation of the impurities, e.g., $H^+$ or $He^+$ ions, under conditions selected such that the predetermined depth of penetration into the substrate is substantially equal to a desired thickness of the gate electrode; step (d) comprises forming perforations in the side surfaces of the implanted first semiconductor substrate along the periphery of the cleavage plane; step (e) comprises providing a second semiconductor substrate having a different dopant concentration than the first semiconductor substrate, the second substrate preferably comprising lightly-doped $p^-$ or $n^-$ type monocrystalline silicon; and step (f) comprises bonding by application of heat and/or pressure or by electrostatic bonding.

According to another aspect of the present invention, a method of fabricating a silicon-based MOS-type semiconductor device having a heavily-doped polysilicon gate electrode comprises the sequential steps of:

(a) providing a first, heavily-doped polysilicon semiconductor substrate of one conductivity type and having opposed first and second major surfaces spaced apart a predetermined distance by a plurality of side surfaces;

(b) forming a thin gate insulator comprising an about 25–50 Å thick silicon oxide layer on the first major surface of the first semiconductor substrate;

(c) implanting $H^+$ or $He^+$ impurity ions into the exposed surface of the silicon oxide gate insulator layer, the $H^+$ or $He^+$ ions passing through the silicon oxide layer and penetrating into the underlying first, heavily-doped polysilicon substrate for a predetermined depth below the first major surface substantially equal to a desired gate electrode thickness, the structural integrity of the first, heavily-doped polysilicon substrate being weakened at the predetermined depth;

(d) cleaving the implanted first, heavily-doped polysilicon substrate along a cleavage plane parallel to the first major surface and located at the predetermined depth, the cleaving including forming perforations in the side surfaces of the impurity implanted first, heavily-doped polysilicon substrate along the periphery of the cleavage plane;

(e) providing a second, lightly-doped monocrystalline silicon substrate of same conductivity type as the first, heavily-doped polysilicon substrate, the second substrate having opposed, spaced-apart, first and second major surfaces; and (f) bonding the exposed surface of the silicon oxide gate insulator layer of the cleaved first, heavily-doped polysilicon substrate to the first major surface of the second, lightly-doped monocrystalline silicon substrate, whereby the first-heavily-doped polysilicon substrate forms an electrically conductive gate electrode in contact with the silicon oxide gate insulator layer, the second, lightly-doped monocrystalline silicon-second substrate is adapted for source/drain formation therein, and dopant depletion of the first, heavily-doped polysilicon substrate with attendant dopant penetration into the underlying silicon oxide gate insulator layer are minimized or substantially prevented.

According to still another aspect of the present invention, improved submicron-dimensioned silicon-based MOS and/or CMOS transistor devices made according to the above-mentioned steps (a)–(f) are provided, wherein a heavily boron-doped polysilicon gate electrode incurs reduced or no boron depletion with attendant penetration of the underlying silicon oxide gate insulator layer.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

Reference is made to the attached drawings, wherein like reference numerals are employed throughout to designate similar features, which drawings are to be taken together with the following detailed description for a full understanding of the features and advantages provided by the present invention, wherein.

DESCRIPTION OF THE INVENTION

Figure 1A:
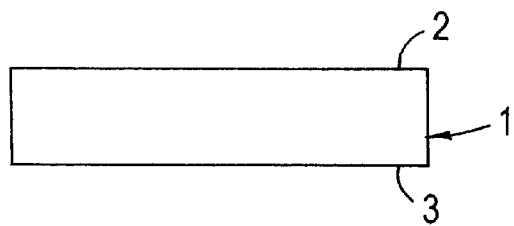
FIGS. 1(A)–(E) illustrate, in simplified cross-sectional form, a sequence of steps for forming improved gate electrodes according to the method of the present invention.
Figure 1B:
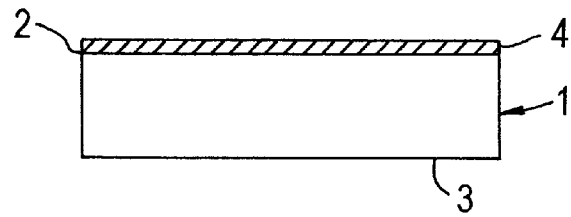

Briefly stated, the present invention fully addresses and solves the above-mentioned problems and drawbacks attendant upon conventional processing for forming submicron-dimensioned MOS and CMOS transistors for use in high-density integrated circuit devices by eliminating ion implantation doping of the gate layer (e.g., of polysilicon) for conductivity enhancement subsequent to formation of the gate layer over the thin gate insulator layer. As a consequence of the inventive methodology, penetration of implanted dopant into the underlying thin gate insulator layer does not occur and post-implantation annealing which can result in dopant depletion of the gate layer by out-diffusion therefrom is not required.

The inventive method comprises, inter alia, an adaptation of the SOITEC process for forming Silicon-On-Insulator ("SOI") type substrates for use in semiconductor manufacture, which process is modified according to the requirements of the present invention for forming layered structures comprising a heavily-doped gate layer, a thin gate insulator layer, and a lightly- or moderately-doped source/drain layer. The SOITEC process comprises the sequential steps of: providing a silicon substrate having first and second opposed major surfaces spaced apart by a plurality of side surfaces; oxidizing one of said major surfaces to form an about 1–2 $\mu$m thick silicon oxide layer thereon; implanting the oxidized surface with impurity ions at a dosage and energy selected for passage of the impurity ions through the silicon oxide layer and penetration into the underlying silicon substrate for a predetermined depth, whereby the structural integrity of the substrate is weakened at the predetermined depth; forming perforations along the side surfaces of the impurity-implanted substrate at the predetermined depth; cleaving the impurity-implanted substrate along a cleavage plane parallel to the implanted, oxidized surface and located at the predetermined depth, thereby separating the substrate into an upper portion comprising the oxidized surface and a lower portion comprising first (i.e., cleaved) and second major surfaces; turning the upper portion by 180° (i.e., "flipping over") to place the oxidized surface of the upper portion in confronting relation to the first surface of the lower portion; and bonding the facing surfaces together to form a SOI laminate.

The inventive method modifies the above-described SOITEC process in significant respect in order to adapt same to the manufacture of gate electrode/gate insulator/semiconductor structures suitable for use in forming MOS and/or CMOS transistor devices. Initially, a heavily-doped $p^+$ or $n^+$ type first semiconductor substrate is selected, typically boron-doped polysilicon of sufficiently high electrical conductivity as to be useful as a gate electrode of MOS-type transistor devices. Secondly, oxidation of the selected major surface of the first semiconductor substrate is carefully controlled to form a very thin (e.g., about 25–50 Å thick), high quality oxide film thereon suitable for use as a gate insulator layer. Thirdly, the penetration depth of the implanted impurity ions in the first substrate is selected to provide a cleavage plane thereat which substantially corresponds to the desired thickness of the gate layer. Finally, after first substrate cleavage, the lower portion thereof is replaced with a lightly- to moderately-doped second semiconductor substrate of same conductivity type as the first substrate suitable for formation of source/drain regions therein as part of the MOS-type transistor, e.g., lightly- to moderately-doped monocrystalline silicon.

Referring now to FIGS. 1(A)–1(E), a sequence for performing an illustrative, but non-limitative embodiment of the present invention is shown therein. Adverting to FIG. 1(A), in a first step according to the inventive process, a first semiconductor substrate 1 is provided having opposed, spaced-apart first and second major surfaces 2 and 3, respectively, which substrate is heavily-doped $p^+$ or $n^+$ type to provide sufficient electrical conductivity for use as a gate of MOS-type transistor devices.

For example, suitable $p^+$ type substrates 1 may comprise heavily boron-doped polysilicon and suitable $n^+$ type substrates may comprise heavily phosphorus- or arsenic-doped polysilicon. In the next step, shown in FIG. 1(B), a thin, high quality gate insulator layer 4, typically of silicon oxide about 25–50 Å thick is formed, as by conventional methodology, on the first major surface 2 of substrate 1.

Figure 1C:
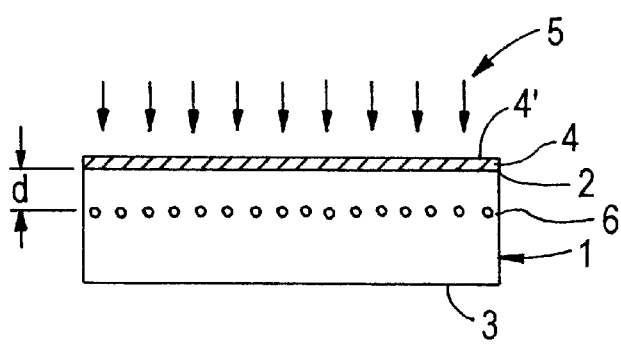

Referring now to FIG. 1(C), the exposed upper surface 4 of the gate insulator layer 4 is then subjected to impurity ion implantation under conditions selected such that the implanted ions 5 pass through the thin gate insulator layer 4 and penetrate for a preselected depth d into the first semiconductor substrate 1 for forming a plane of weakened structural integrity (as by implantation-induced lattice damage) at said preselected depth d selected to substantially correspond to a desired gate layer thickness. By way of illustration but not limitation, in the case of a polysilicon substrate 1, implantation of $H^+$ or $He^+$ ions through an overlying 25–50 Å thick silicon oxide gate insulator layer can be performed to form a plane of weakened structural integrity at a depth d below first substrate first surface 2 corresponding to typical heavily-doped polysilicon gate layer thicknesses. In order to facilitate cleavage along the desired plane, perforations 6 are optionally formed along the side surfaces of substrate 1, as by laser drilling or other suitable technique.

Figure 1D:
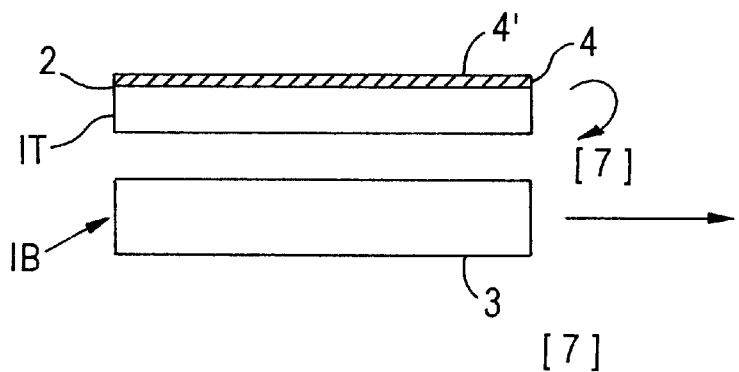

In the next step, shown in FIG. 1(D), substrate 1 is cleaved along a cleavage plane located substantially at depth d of weakened structural integrity, as with the aid of a diamond-tipped wedge and a suitable pressure impulse applying means (e.g., a mallet or pneumatic ram, etc.). The resultant top substrate portion 1T is then rotated by 180° (i.e., "flipped over") to downwardly position the gate insulator layer 4 and the bottom substrate portion 1B is removed, each motion being as indicated by the respective curved and straight arrows shown in the figure.

Figure 1E:
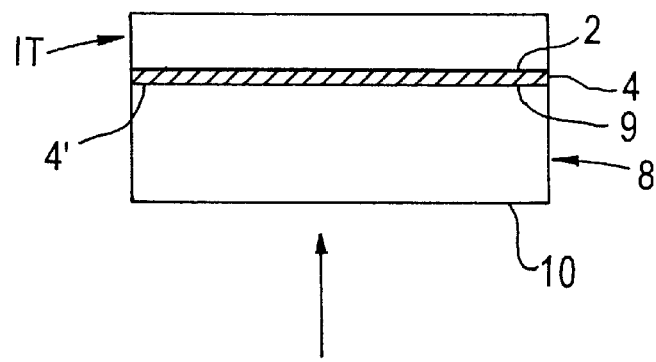

Referring now to FIG. 1(E), in the next step according to the inventive method, a second, lightly- to moderately doped semiconductor substrate 8 of same conductivity type as the first semiconductor substrate 1 (e.g., monocrystalline silicon) and comprising opposed, spaced-apart first and second surfaces 9 and 10, respectively, is positioned beneath and in contact with the inverted first substrate upper portion 1T for bonding together of the exposed surface 4' of gate insulator layer 4 and the first surface 9 of the second semiconductor substrate 8. Bonding is accomplished in conventional manner, as, for example, by application of heat and/or pressure to the mating surfaces, or by electrostatic bonding at low temperature. The processing steps corresponding to FIGS. 1(A)–1(E) may be performed in an inert atmosphere, if necessary or desirable, for minimizing or preventing atmospheric contamination of the high quality thin gate insulator layer 4, as is conventional in the art.

The resultant structure comprising a lightly-doped monocrystalline silicon second substrate 8 bonded to an overlying similar conductivity type, heavily-doped polysilicon first substrate via a high-quality thin silicon oxide gate layer is then subjected to further processing, including patterning of the gate layer 1T and underlying gate oxide layer 4 for defining active areas of second substrate 8 for source/drain formation thereat. The upper surface of gate layer 1T can be masked off during subsequent implantation processing for source/drain formation in the active areas of the second substrate 8, thereby significantly reducing or substantially preventing dopant penetration of the gate oxide layer. Moreover, dopant depletion of the gate layer is minimized by the absence of a requirement for post-implantation thermal annealing of the gate layer due to the elimination of ion implantation thereinto according to the inventive method.

The present invention thus enables the manufacture of various types of semiconductor devices, including MOS and CMOS transistor devices without incurring dopant depletion of the gate electrode and attendant dopant penetration of underlying gate insulator layers, as occurs with conventional processing methodology. The present invention has particular industrial applicability in the manufacture of submicron-dimensioned, high-density integration semiconductor devices having a design rule of about 0.18 μm and below, in that the inventive methodology effectively reduces or eliminates deleterious dopant depletion, particularly boron depletion from gate layers with attendant boron penetration of underlying gate oxide layers.

The present invention can be advantageously implemented by employing conventional materials, methodology, and equipment. Accordingly, the details of such conventional materials, methodology, and equipment are not set forth herein in detail. In the previous descriptions, numerous specific details are set forth, such as specific materials, structures, processes, etc., in order to provide a thorough understanding of the present invention. However, it should be recognized that the present invention can be practiced without resorting to the details specifically set forth. In other instances, well-known processing structures, etc., have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is likewise capable of changes or modifications within the scope of the inventive concept as expressed herein.

What is claimed:

1. A method of fabricating a semiconductor device comprising a gate insulator layer and an overlying electrically conductive gate layer, which method comprises the sequential steps of:
   (a) providing a first, p$^+$ or n$^+$ type semiconductor substrate of a thickness and having opposed first and second major surfaces spaced apart by a plurality of side surfaces;
   (b) forming a gate insulator layer on said first major surface of said first substrate;
   (c) implanting impurities into the exposed surface of said gate insulating layer, said impurities passing through said gate insulating layer and penetrating into the underlying first semiconductor substrate for a depth below said first major surface, the structural integrity of said first substrate being weakened at said depth;
   (d) cleaving the impurity-implanted first substrate along a cleavage plane parallel to said first major surface and located at said depth;
   (e) providing a second semiconductor substrate of the same conductivity type as said first substrate, said second substrate having opposed, spaced apart first and second major surfaces; and
   (f) bonding said exposed surface of said gate insulating layer of the cleaved first substrate to the first major surface of said second substrate, whereby said first, semiconductor substrate forms an electrically conductive gate electrode in contact with the gate insulator layer, and wherein dopant depletion of the first semiconductor substrate with attendant penetration of the dopant into the gate insulator layer is reduced or substantially prevented.

2. The method as in claim 1, wherein: step (a) comprises providing a silicon semiconductor substrate.

3. The method as in claim 2, wherein said silicon comprises polysilicon.

4. The method as in claim 3, wherein: step (b) comprises forming a silicon oxide gate insulating layer about 25–50 Å thick.

5. The method as in claim 1, wherein: step(c) comprises ion implantation of said impurities and the implantation conditions are selected such that said depth of penetration into said substrate is substantially equal to the thickness of said gate electrode.

6. The method as in claim 5, wherein said semiconductor substrate comprises silicon and step (c) comprises implantation of H$^+$ or He$^+$ ions.

7. The method as in claim 6, wherein said thin gate insulating layer comprises a silicon oxide layer about 25–50 Å thick, and step (c) comprises implantation of H$^+$ or He$^+$ ions.

8. The method as in claim 1, wherein step (d) comprises forming perforations in said side surfaces of said impurity-implanted first substrate along the periphery of said cleavage plane.

9. The method as in claim 1, wherein step (e) comprises providing a second semiconductor substrate having a different dopant concentration than said first semiconductor substrate.

10. The method as in claim 9, wherein said first semiconductor substrate is heavily doped, p$^+$ or n$^+$ type, and said second semiconductor substrate is lightly-doped p$^-$ or n$^-$ type.

11. The method as in claim 10, wherein said first, heavily-doped semiconductor substrate comprises polysilicon and said second, lightly-doped semiconductor substrate comprises monocrystalline silicon.

12. The method as in claim 1, wherein step (f) comprises bonding by application of heat and/or pressure.

13. The method as in claim 1, wherein step (f) comprises electrostatic bonding.

14. A method of fabricating a silicon-based MOS-type semiconductor device having a heavily-doped polysilicon gate, which method comprises the sequential steps of:
   (a) providing a first, heavily-doped polysilicon semiconductor substrate of one conductivity type and having opposed first and second major surfaces spaced apart at a distance by a plurality of side surfaces;
   (b) forming a thin gate insulator comprising an about 25–50 Å thick silicon oxide layer on said first major surface of said first substrate;
   (c) implanting impurity ions into the exposed surface of said silicon oxide gate insulator layer, the impurity ions passing therethrough and penetrating into the underlying first, heavily-doped polysilicon substrate for a depth below said first major surface substantially equal to a desired gate electrode thickness, the structural integrity of said first, heavily-doped polysilicon substrate being weakened at said depth;
   (d) cleaving the impurity-implanted first, polysilicon substrate along a cleavage plane parallel to said first major surface and located at said depth, said cleaving including forming perforations in the side surfaces of the implanted first, polysilicon substrate along the periphery of said cleavage plane;

(e) providing a second, lightly-doped monocrystalline silicon substrate of same conductivity type as said first, heavily-doped polysilicon substrate, said second substrate having opposed, spaced apart first and second major surfaces; and (f) bonding said exposed surface of said silicon oxide gate insulator layer of the cleaved first, heavily-doped polysilicon substrate to the first major surface of the second, lightly-doped monocrystalline silicon substrate; whereby said first, heavily-doped semiconductor substrate forms an electrically conductive gate electrode in contact with said thin gate insulator layer, and wherein dopant depletion of said first semiconductor substrate with attendant penetration of the dopant into the underlying thin gate insulator layer is minimized or substantially prevented.

15. The method as in claim 14, wherein step (c) comprises implanting $H^+$ or $He^+$ impurity ions.

16. The method as in claim 14, wherein step (a) comprises providing a first, heavily boron-doped $p^+$ type polysilicon substrate.

\* \* \* \* \*